United States Patent [19]

Bae

[11] Patent Number: 5,498,500
[45] Date of Patent: Mar. 12, 1996

[54] OVERLAY MEASUREMENT MARK AND METHOD OF MEASURING AN OVERLAY ERROR BETWEEN MULTI PATTERNS IN A SEMICONDUCTOR DEVICE USING THE MEASUREMENT MARK

[75] Inventor: Sang M. Bae, Seoul, Rep. of Korea

[73] Assignee: Hyundai Electronics Industries Co., Ltd., Rep. of Korea

[21] Appl. No.: 364,047

[22] Filed: Dec. 27, 1994

[30] Foreign Application Priority Data

Dec. 27, 1993 [KR] Rep. of Korea .................. 93-29789

[51] Int. Cl.⁶ ................................................. G03F 9/00
[52] U.S. Cl. ........................... 430/22; 430/5; 430/30; 355/53
[58] Field of Search .................. 430/22, 5, 30; 355/53

[56] References Cited

U.S. PATENT DOCUMENTS 4,883,359  11/1989  Ina et al. .
5,389,479  2/1995  Morimoto et al. ................. 430/59

FOREIGN PATENT DOCUMENTS 2-60120  2/1990  Japan .

*Primary Examiner*—S. Rosasco
*Attorney, Agent, or Firm*—Fish & Richardson

[57] ABSTRACT

An overlay measurement mark and a method of measuring an overlay error between multi patterns of a semiconductor device. A first overlay measurement patterns are formed on a first selected portion of a scribe line by a first mask which is formed considering the margin between the first mask pattern and the second pattern, with the first overlay measurement pattern consisting of two patterns spacing parallel to each other. A second overlay measurement patterns are formed on a second selected portion of the scribe line by a second mask which is formed considering the margin between the second mask pattern and the third mask pattern so as not to superimpose the first overlay measurement patterns, with the second overlay measurement patterns consisting of two patterns spacing parallel to each other. A third overlay measurement pattern is formed on the scribe line by a third mask which is used to form the third mask pattern, with said third overlay measurement pattern forming at the center of inside the first and second overlay measurement patterns. The distance between the first overlay measurement patterns and the third overlay measurement pattern, and the distance between the second overlay measurement patterns and the third overlay measurement pattern, are measured.

8 Claims, 2 Drawing Sheets

OVERLAY MEASUREMENT MARK AND METHOD OF MEASURING AN OVERLAY ERROR BETWEEN MULTI PATTERNS IN A SEMICONDUCTOR DEVICE USING THE MEASUREMENT MARK

FIELD OF THE INVENTION

The present invention relates to an overlay measurement mark and a method of measuring an overlay error of multi patterns in a semiconductor device using the measurement mark, and more particularly to an overlay measurement mark and a method of measuring an overlay error of multi patterns in a semiconductor device using the measurement mark which can reduce the required time and the number of measurements taken to measure with an overlay measurement mechanism an overlay error between multi patterns which are formed on a product die.

INFORMATION DISCLOSURE STATEMENT

Generally, an overlay measurement mechanism is used in measuring an overlay error between multi patterns which are formed on a product die.

FIG. 2 is a plan view of an overlay measurement mark to illustrate a prior art method of measuring an overlay error of multi patterns.

An overlay measurement mark is formed on a scribe line of a wafer using a plurality of masks, with the masks identical to the one used in the formation of patterns on a product die of the wafer. As shown in FIG. 2 to form overlay measurement marks according to the lay-out of FIG. 1, an outer overlay measurement mark 1 corresponding to the conductive region H of FIG. 1 is formed on a scribe line(not shown in FIG. 2) using a pattern mask. And after that, an inner overlay measurement mark 2 corresponding to contact regions F and G of FIG. 1 is formed on the scribe line using a contact mask, with the inner mark 2 forming from the inside the outer mark 1. The outer mark 1 is formed with conductive material while the inner mark 2 is formed with photoresist.

In the overlay measurement method, distances A and A' between the two marks 1 and 2 are measured as a degree of overlay in the X-axis, and the difference A—A' between the two distances is taken as an overlay error in the X-axis. Similarly, distances B and B' between the two marks 1 and 2 are measured as a degree of overlay in the Y-axis, and the difference B—B' between the two distances is taken as an overlay error in the Y-axis.

The above described method can measure only the overlay error between two patterns. Therefore, to measure the overlay errors between three or more patterns which are formed on the product die, an overlay error must be measured for each two patterns by forming overlay measurement marks in separate positions on the scribe line. Several measurements are required depending on the number of patterns for which the overlay errors are to be measured. Furthermore, additional space is required because the additional overlay measurement marks must be placed in places other than the place where the measurement marks for measuring the overlay error between the other two patterns were formed, and also a separate measurement program must be prepared for the overlay measurement mechanism to measure the overlay errors of a plurality of patterns.

SUMMARY OF THE INVENTION

Therefore, an object of the present invention is to provide an overlay measurement mark and a method of measuring the overlay error of multi patterns in a semiconductor device using the measurement marks capable of measuring the overlay errors between multi patterns at one time.

To achieve the above object, the method of measuring an overlay error between multi patterns according to the present invention, comprises the steps of:

forming a first overlay measurement pattern on a first selected portion of a scribe line with a first mask which is formed taking into consideration the x and y-axis margin between the first mask pattern and the third mask pattern which are formed on a product die, with the first overlay measurement pattern including two patterns spacing parallel to each other; forming a second overlay measurement pattern on a second selected portion of the scribe line with a second mask which is formed taking into consideration the X and Y-axis margin between the second mask pattern and third mask pattern which are formed said product die, so as not to superimpose the first overlay measurement patterns, with the second overlay measurement patterns including two patterns spaced parallel to each other; forming a third overlay measurement pattern on the scribe line with a third mask which is used to form the third pattern, with the third overlay measurement patterns forming at the center of the inside the first and second overlay measurement patterns; and measuring the distance between the first overlay measurement patterns and the third overlay measurement patterns, and the distance between the third overlay measurement patterns, and the distance between the second overlay measurement patterns and the third overlay measurement patterns.

BRIEF DESCRIPTION OF THE DRAWINGS

To better understand the nature and objects of the invention, reference should be made to the following detailed description taken in conjunction with the accompanying drawings in which.

Similar reference characters refer to similar parts through the several views of the drawings.

DETAILED DESCRIPTION OF THE INVENTION

Figure 1:
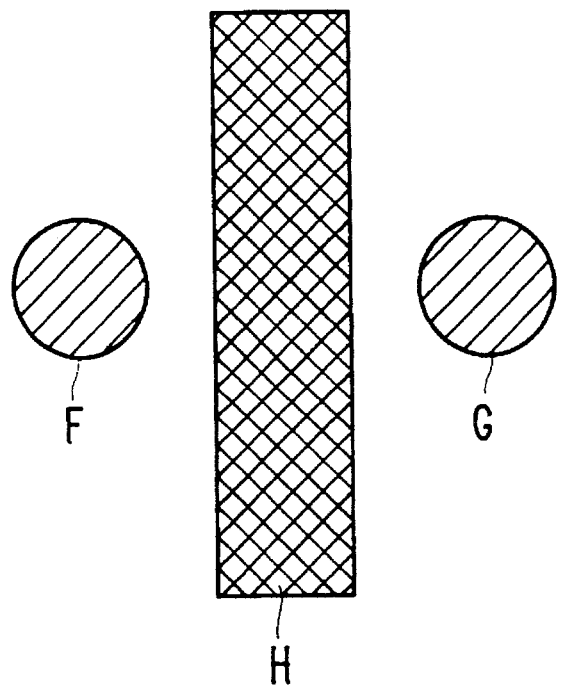
FIG. 1 is a lay-out of a semiconductor device on which two patterns are shown.
Figure 2:
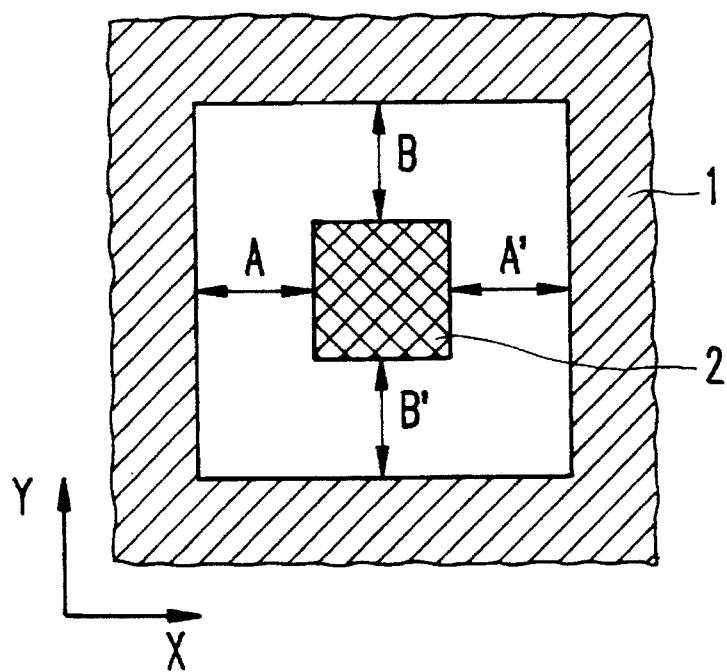
FIG. 2 is a plan view of an overlay measurement mark to illustrate a prior art method of measuring an overlay error of a pattern.
Figure 3:
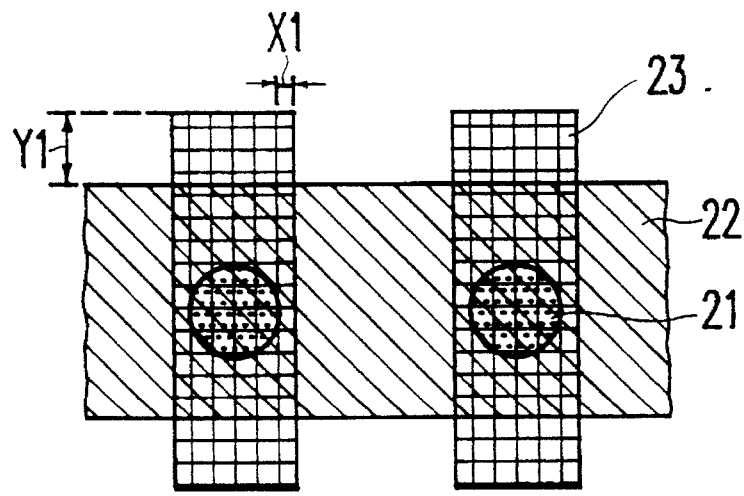
FIG. 3 is a lay-out of a semiconductor device on which three patterns are shown.
Figure 4:
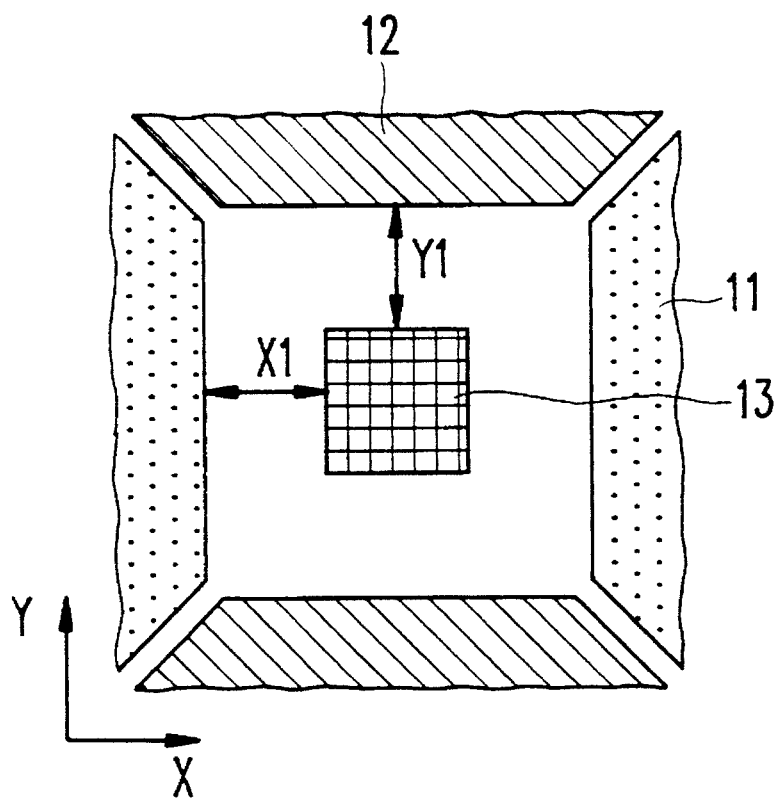
FIG. 4 is a plan view of an overlay measurement mark to illustrate the method of measuring an overlay error of a pattern according to the present invention.

FIG. 4 is a plan view showing an overlay measurement mark corresponding to a lay-out of FIG. 3. This invention will be described referring to FIG. 3 and FIG. 4.

Referring to FIG. 3, a contact region 21, a first conductive region 22 and a second conductive region 23 are shown. The Y-axis margin is more important than the X-axis margin in view of the overlay error between the second conductive region 23 and the first conductive region 22; that is, the distance Y1 becomes a major factor in determining the overlay error. The X-axis margin is more important than the Y-axis margin in view of the overlay error between the second conductive region 23 and the contact region 21; that is, the distance X1 becomes a main factor in determining the overlay error. To measure the overlay error of multiple patterns of three layers as shown in FIG. 3 at one time, an overlay measurement mark as shown in FIG. 4 is formed. That is, a first overlay measurement patterns 11 which are composed of two patterns spacing parallel to each other are formed on a first selected portion of a scribe line (not shown in FIG. 4) by a first mask which is formed considering the margin between a first mask pattern and a third mask pattern, that is, the distance X1 of FIG. 3. A second overlay measurement patterns 12 which are composed of two patterns spacing parallel to each other are formed on a second selected portion of the scribe line by a second mask which is formed considering only the margin between a second mask pattern and the third mask patterns, that is, the distance Y1 of FIG. 3. The first and second overlay marks 11 and 12 must be formed so that their measurement patterns 11 and 12 are not superimposed on each other. Accordingly, a rectangular exterior box is created by the first and second overlay measurement patterns 11 and 12. And after that, a third overlay measurement patterns 13 is formed at the center of inside the rectangular exterior box by a third mask which is used to form the second conductive region 23. The first and second overlay measurement patterns 11 and 12 are formed with conductive material while the third overlay measurement pattern 13 is formed with photoresist. However, if the third overlay measurement pattern 13 is formed with conductive material, any one of the first and second overlay measurement patterns 11 and 12 must be formed with photoresist. After the overlay measurement patterns as shown in FIG. 4 are formed by the above method, the distance X1 between the first overlay measurement patterns 11 and the third overlay measurement pattern 13 and the distance Y1 between the second overlay measurement patterns 12 and the third overlay measurement pattern 13 are measured with the overlay measurement mechanism. The overlay errors are determined by the distance X1 and Y1.

To increase the accuracy of measurement, each corner where the first overlay measurement patterns 11 are adjacent to the second overlay measurement patterns 12 is spaced at a distance of 0.5 to 2 μm and is graded at an angle of 0 to 90 degrees. However, it is desirable that the angle be 45 degrees.

As described above, the present invention can reduce the measurement time and the additional space required for the overlay mark formation by forming only absolutely necessary overlay measurement patterns. It can simplify the comparison of the degree of overlay after easily measuring the overlay error between multi patterns with the overlay measurement mechanism. Finally, it can reduce the manufacturing process by simplifying the measurement of the overlay error between multi patterns.

Although this invention has been described in its preferred embodiment with a certain degree of particularity, one skilled in the art would know that the preferred embodiment disclosed here is only an example and that the construction, combination and arrangement of its parts may be varied without departing from the spirit and scope of the invention.

What is claimed is:

1. An overlay measurement mark comprising:

first overlay measurement patterns formed on the Y-axis of a scribe line, with said first overlay measurement patterns including two patterns spaced from one another and parallel to each other;

second overlay measurement patterns formed on the X-axis of said scribe line, with said second overlay measurement patterns including two patterns spaced from one another and parallel to each other, so that said first and second overlay patterns create a rectangular exterior box; and a third overlay measurement pattern formed on said scribe line, with said third overlay mark formed inside said rectangular exterior box formed by said first and second overlay marks.

2. The mark of claim 1, wherein each portion where said first overlay measurement patterns are adjacent to said second overlay measurement patterns is spaced at a distance of 0.5 to 2 μm and is graded at an angle of 0 to 90 degrees.

3. The mark of claim 1, wherein each portion where said first overlay measurement patterns are adjacent to said second overlay measurement patterns is spaced at a distance of 0.5 to 2 μm and is graded at an angle of 45 degrees.

4. The mark of claim 1, wherein any one of said first, second, third overlay marks is formed with photoresist, and the residual marks are formed with conductive material.

5. A method of measuring an overlay error between multiple patterns in a semiconductor device, comprising the steps of:

forming first overlay measurement patterns on a first selected portion of a scribe line with a first mask which is formed taking into consideration an X and Y-axis margin between the first mask pattern and the third mask pattern which are formed on a product die, with said first overlay measurement patterns including two patterns spaced parallel to each other;

forming second overlay measurement patterns on a second selected portion of said scribe line with a second mask which is formed taking into consideration X and Y-axis margins between the second mask pattern and said third mask pattern so as not to superimpose said first overlay measurement pattern, said second overlay measurement patterns including two patterns spaced parallel to each other;

forming third overlay measurement patterns on said scribe line with a third mask which is used to form said third mask pattern, said third overlay measurement patterns formed at a center of an inside of said first and second overlay measurement patterns; and measuring a distance between said first overlay measurement patterns and said third overlay measurement patterns, and a distance between said second overlay measurement patterns and said third overlay measurement patterns.

6. The method of claim 5, wherein each portion where said first overlay measurement patterns are adjacent to said second overlay measurement patterns is spaced at a distance of 0.5 to 2 μm and is graded at an angle of 0 to 90 degrees.

7. The method of claim 5, wherein each portion where said first overlay marks are adjacent to said second overlay marks is spaced at a distance of 0.5 to 2 μm and is graded at an angle of 45 degrees.

8. The method of claim 5, wherein any one of said first, second, third overlay measurement patterns is formed with photoresist, and the residual marks are formed with conductive material.

\* \* \* \* \*